US 10,514,285 B2

(12) United States Patent
Shimura et al.

(10) Patent No.: US 10,514,285 B2
(45) Date of Patent: Dec. 24, 2019

(54) DRIVE CIRCUIT AND ELECTROMAGNETIC FLOWMETER

(71) Applicant: Yokogawa Electric Corporation, Musashino-shi, Tokyo (JP)

(72) Inventors: Toru Shimura, Tokyo (JP); Gouki Nakayama, Tokyo (JP); Junichi Iwashita, Tokyo (JP)

(73) Assignee: Yokogawa Electric Corporation, Tokyo (JP)

( * ) Notice: Subject to any disclaimer, the term of this patent is extended or adjusted under 35 U.S.C. 154(b) by 130 days.

(21) Appl. No.: 15/665,593

(22) Filed: Aug. 1, 2017

(65) Prior Publication Data

US 2018/0038721 A1 Feb. 8, 2018

(30) Foreign Application Priority Data

Aug. 3, 2016 (JP) .................. 2016-153037

(51) Int. Cl.
  *G01F 1/58* (2006.01)
  *G01R 19/165* (2006.01)
  *G01R 31/02* (2006.01)
  *G01F 25/00* (2006.01)
  *G01F 1/60* (2006.01)

(52) U.S. Cl.
  CPC .............. *G01F 1/588* (2013.01); *G01F 1/60* (2013.01); *G01F 25/0007* (2013.01); *G01R 19/16533* (2013.01); *G01R 31/025* (2013.01)

(58) Field of Classification Search
  CPC ........ G01F 1/588; G01F 1/60; G01F 25/0007; G01R 19/16533; G01R 31/025
  USPC ...................................... 73/861.11
  See application file for complete search history.

(56) References Cited

U.S. PATENT DOCUMENTS 3,783,686 A * 1/1974 Hentschel ................. G01F 1/60
                                                    73/861.16

FOREIGN PATENT DOCUMENTS

| JP | 9-325058 A | 12/1997 |
| JP | 2009-156681 A | 7/2009 |
| JP | 2009156681 A * | 7/2009 |
| JP | 2012-191735 A | 10/2012 |

OTHER PUBLICATIONS

Translation of JP-2009156681-A provided by the Applicant (Year: 2009).*

* cited by examiner

*Primary Examiner* — Nathaniel T Woodward
(74) *Attorney, Agent, or Firm* — Sughrue Mion, PLLC (57) ABSTRACT

A drive circuit includes a primary power supplier which supplies a primary electric power in accordance with a state of the drive circuit, a secondary power supplier which supplies an operation electric power and an excitation electric power, an excitation current supplier which supplies an excitation current to an excitation coil, a power supply monitor which compares the voltage value of the operation electric power with a voltage threshold and outputs monitoring information, and a controller which determines whether a short circuit has occurred in the excitation coil based on the monitoring information, and stops supplying the excitation current if the short circuit has occurred. The voltage threshold is higher than a lowest voltage value with which the controller operates, and the voltage threshold is a voltage value representing that the short circuit has occurred in the excitation coil.

18 Claims, 3 Drawing Sheets

DRIVE CIRCUIT AND ELECTROMAGNETIC FLOWMETER

BACKGROUND

Technical Fields

The disclosure relates to a drive circuit and an electromagnetic flowmeter.

Priority is claimed on Japanese Patent Application No. 2016-153037, filed Aug. 3, 2016, the contents of which are incorporated herein by reference.

Related Art

Field devices (measurement devices and manipulation devices) are installed in a plant which has various types of facilities, for the purpose of monitoring a state of each facility installed in the plant and controlling an operation of the facility. As one of the measurement devices included in the field devices, there is an electromagnetic flowmeter which is mounted on a pipe installed in the plant. The electromagnetic flowmeter measures a flow rate of conductive fluid flowing in the pipe, and outputs information representing the measured flow rate. In a pump or a valve installed with the pipe in the plant as one of the manipulation devices of the field devices, the information representing the flow rate of the fluid measured by the electromagnetic flowmeter is used for controlling flow of the fluid in the pipe (controlling drive of the pump or opening and closing the valve).

In the electromagnetic flowmeter, a sensor which has a pair of electrodes and an excitation coil for generating a magnetic field measures the flow rate of the conductive fluid flowing in the pipe. Specifically, the electromagnetic flowmeter measures an electromotive force (voltage) generated when the conductive fluid flows through the magnetic field generated by the excitation coil provided in the sensor by using the pair of electrodes provided in the sensor. At this time, in the electromagnetic flowmeter, the magnetic field generated by the excitation coil provided in the sensor is controlled in accordance with an excitation current supplied to the excitation coil by a drive circuit including the excitation circuit. The electromagnetic flowmeter calculates a velocity of the fluid (fluid velocity) based on the electromotive force (voltage value) measured by the pair of the electrodes provided in the sensor. Thereafter, the electromagnetic flowmeter calculates a flow rate based on the calculated fluid velocity, and outputs information representing the calculated flow rate.

In the plant, in order to operate safely, daily or periodic inspection works for the facilities and works for solving troubles such as malfunction and failure are conducted. These works include inspection works for maintaining a normality of the field devices installed in each facility (in other words, for enabling the filed device to measure the state of the facility accurately). Therefore, in the field device installed in each facility, a function for notifying a worker performing the inspection work whether the field device is operating normally or not (in other words, whether or not malfunction or failure occurs in the field device) is desired. In the field device, it is desired that even if malfunction or failure occurs, the malfunction or the failure which has occurred does not causes malfunction or failure of other components. Therefore, various techniques for protecting the other components provided in the field device from the malfunction or the failure which has occurred in the field device have been proposed.

For example, a technology of an electromagnetic flowmeter which protects a circuit when an excessive excitation current flows through an excitation coil because of short circuit of the excitation coil is disclosed in Japanese Patent Application Publication No. H9-325058. Specifically, an electromagnetic flowmeter which has a reference resistance for detecting an excitation current supplied to the excitation coil by an excitation control circuit in order to control a magnetic field which is to be generated and a protection circuit which turns off (stops) the supply of the excitation current when a reference voltage generated in the reference resistance exceeds a predetermined value is disclosed in Japanese Patent Application Publication No. H9-325058.

However, in the electromagnetic flowmeter disclosed in Japanese Patent Application Publication No. H9-325058, if noise is mixed in the protection circuit after the protection circuit has turned off (stopped) the supply of the excitation current, the supply of the excitation current which was stopped may be restarted, and stopping and restarting the supply of the excitation current may be repeated. The repetition of stopping and restarting the supply of the excitation current causes a deterioration of a circuit in the electromagnetic flowmeter with a lapse of time, and it also causes that the circuit in the electromagnetic flowmeter is broken finally. For example, the repetition of the supply of excessive excitation current causes a repetition of over-rating in each circuit provided in the electromagnetic flowmeter and a heat generation of the circuit caused by the over-rating. If the over-rating and the heat generation has been repeated for a long time, the circuit is broken. At this time, in the electromagnetic flowmeter disclosed in Japanese Patent Application Publication No. H9-325058, it may be thought that a signal processing circuit provided in the electromagnetic flowmeter forcibly continues stopping the supply of the excitation current before the circuit of the electromagnetic flowmeter is broken, in order to protect the circuit. However, when the excessive excitation current flows, the voltage of power supply of the signal processing circuit is decreased because of the excessive excitation current, and a signal for initializing (resetting) the signal processing circuit is input. Therefore, the signal processing circuit stops the operation. For this reason, the signal processing circuit cannot perform the process for forcibly continuing to stop the supply of the excitation current and protecting the circuit, and cannot perform a process for a state before resetting.

SUMMARY

A drive circuit may drive an excitation coil for generating a magnetic field. The drive circuit may include a primary power supplier configured to supply a primary electric power in accordance with a state of the drive circuit, a secondary power supplier configured to supply an operation electric power in accordance with the primary electric power supplied from the primary power supplier, and supply an excitation electric power of which voltage value is different from a voltage value of the operation electric power, an excitation current supplier to which the excitation electric power is supplied, the excitation current supplier being configured to supply an excitation current to the excitation coil, a power supply monitor configured to compare the voltage value of the operation electric power with a predetermined voltage threshold, the power supply monitor being configured to output monitoring information representing whether or not the voltage value of the operation electric power is lower than the voltage threshold, and a controller configured to determine whether a short circuit has occurred in the excitation coil based on the monitoring information, the controller being configured to stop supplying the excitation current from the excitation current supplier to the excitation coil if the controller determines that the short circuit has occurred in the excitation coil. The voltage threshold is higher than a lowest voltage value with which the controller operates, and the voltage threshold is a voltage value representing that the short circuit has occurred in the excitation coil.

Further features and aspects of the present disclosure will become apparent from the following detailed description of exemplary embodiments with reference to the attached drawings.

DETAILED DESCRIPTION OF THE EMBODIMENTS

The embodiments of the present invention will be now described herein with reference to illustrative preferred embodiments. Those skilled in the art will recognize that many alternative preferred embodiments can be accomplished using the teaching of the present invention and that the present invention is not limited to the preferred embodiments illustrated herein for explanatory purposes.

An aspect of the present invention is to provide a drive circuit which stops a supply of an excessive excitation current and protect a circuit, and an electromagnetic flowmeter which includes the drive circuit.

Figure 1:
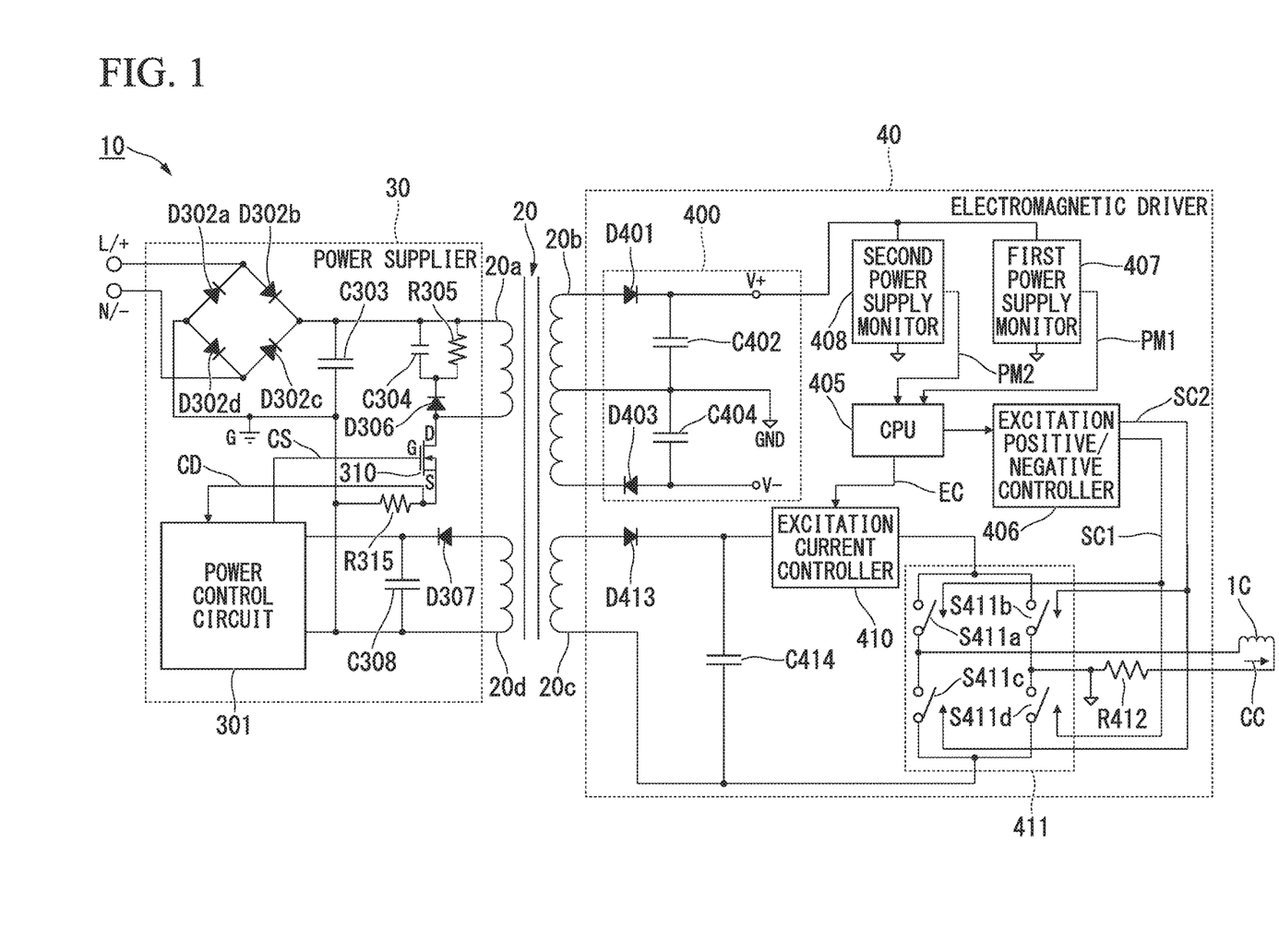
FIG. 1 is a block diagram illustrating an example of configuration of the drive circuit in the embodiment of the present invention.

Hereinafter, embodiments of the present invention will be described with reference to drawings. In the following description, a case where a drive circuit of the present embodiment is an excitation circuit which supplies an excitation current for generating a magnetic field by an excitation coil provided in a sensor in the electromagnetic flowmeter will be described. FIG. 1 is a block diagram illustrating an example of configuration of the drive circuit in the embodiment of the present invention. The drive circuit 10 includes a transformer 20, a power supplier 30, and an electromagnetic driver 40. The drive circuit 10 supplies an excitation current of AC (Alternating Current) for generating a magnetic field to an excitation coil 1C connected to the electromagnetic driver 40.

The transformer 20 includes a primary winding 20a, a secondary winding 20b, a secondary winding 20c, and a tertiary winding 20d. The transformer 20 transmits the electric power, which has been supplied from the power supplier 30 to the primary winding 20a, to the secondary winding 20b, the secondary winding 20c, and the tertiary winding 20d. Specifically, an electric power supplied from the power supplier 30 to the primary winding 20a is transmitted to the electromagnetic driver 40 by the secondary winding 20b and the secondary winding 20c. On the other hand, the electric power supplied from the power supplier 30 to the primary winding 20a returns to the power supplier 30 by the tertiary winding 20d.

The power supplier 30 is a switching power supplier which functions as a primary-side circuit for rectifying the power (electric power) supplied to a power supply terminal L/+ and a power supply terminal N/− and for supplying the rectified electric power to the transformer 20. The power supplier 30 includes a power control circuit 301, a diode D302a, a diode D302b, a diode D302c, a diode D302d, a capacitor C303, a capacitor C304, a resistance R305, a diode D306, a diode D307, a capacitor C308, a field-effect transistor (FET) 310 for power supply, and a current detection resistance R315.

The power control circuit 301 controls the electric power supplied to the transformer 20 by the power supplier 30. The power control circuit 301 is such as a power supply control 1C.

A bridge circuit and a switching power supply circuit are provided in the power supplier 30. The bridge circuit includes the diode D302a, the diode D302b, the diode D302c, and the diode D302d. The switching power supply circuit supplies power to the primary winding 20a of the transformer 20 by using the capacitor C303, the capacitor C304, the resistance R305, the diode D306, and the power supply FET 310.

The bridge circuit includes a first input terminal of the bridge circuit to which a cathode terminal of the diode D302a and an anode terminal of the diode D302b are connected. The bridge circuit includes a second input terminal of the bridge circuit to which an anode terminal of the diode D302c and a cathode terminal of the diode D302d are connected. The first input terminal of the bridge circuit provided in the switching power supply circuit is a power supply terminal L/+ of the power supplier 30. The second input terminal of the bridge circuit is a power supply terminal N/− of the power supplier 30. The bridge circuit includes a first output terminal of the bridge circuit to which a cathode terminal of the diode D302b and a cathode terminal of the diode D302c are connected. The bridge circuit includes a second output terminal of the bridge circuit to which an anode terminal of the diode D302a and an anode terminal of the diode D302d are connected. The first output terminal of the bridge circuit, a first terminal of the capacitor C303, and a first terminal of the capacitor C304, and a first terminal of the resistance R305 are connected to the first terminal of the primary winding 20a of the transformer 20. The second output terminal of the bridge circuit and a second terminal of the capacitor C303 are grounded. A second terminal of the capacitor C304 and a second terminal of the resistance R305 are connected to a cathode terminal of the diode D306. An anode terminal of the diode D306 and a drain terminal of the power supply FET 310 are connected to a second terminal of the primary winding 20a of the transformer 20.

In the switching power supply circuit, the drain terminal of the power supply FET 310 is connected to the second terminal of the primary winding 20a of the transformer 20. The power supply FET 310 performs a switching operation in accordance with an FET control signal CS transmitted from the power control circuit 301 and input to the gate terminal, in order to supply a rectified electric power to the primary winding 20a of the transformer 20.

The power supplier 30 detects a value of current flowing through the switching power supply circuit. If a voltage value of the electric power supplied to the primary winding 20a of the transformer 20 is equal to or higher than a predetermined voltage value, the power supplier 30 stops the electric power supplied from the switching power supply circuit to the primary winding 20a of the transformer 20. In other words, the power supplier 30 has a limit function for limiting the electric power supplied from the switching power supply circuit to the primary winding 20a of the transformer 20.

Specifically, in the power supplier 30, the limit circuit is configured by a current detection resistance R315 and a power control circuit 301. In the limit circuit, a first terminal of the current detection resistance R315 is connected to a source terminal (and a back gate terminal) of the power supply FET 310. Further, the first terminal of the current detection resistance R315 is also connected to a current detection signal input terminal of the power control circuit 301. The second terminal of the current detection resistance R315 is grounded. Thereby, the current detection resistance R315 detects the value of current flowing through the switching power supply circuit, and outputs a current detection signal CD representing the detected current value to the current detection signal input terminal of the power control circuit 301. The power control circuit 301 determines the electric power to be supplied from the switching power supply circuit to the primary winding 20a of the transformer 20 based on the current detection signal CD output from the current detection resistance R315. If the power control circuit 301 determines that a voltage value of the electric power supplied from the switching power supply circuit to the primary winding 20a of the transformer 20 is equal to or higher than a predetermined voltage value, the power control circuit 301 outputs an FET control signal CS for stopping the supply of electric power to the gate terminal of the power supply FET 310. Thereby, the power supplier 30 can prevent an excessive electric power from being supplied from the switching power supply circuit to the primary winding 20a of the transformer 20.

As a cause of the voltage value of the electric power supplied to the primary winding 20a of the transformer 20 by the switching power supply circuit becoming equal to or higher than the predetermined voltage value, a following case can be considered. For example, it can be considered that an excessive excitation current flows through the excitation coil 1C to which the excitation current is supplied from the electromagnetic driver 40 because of a failure such as short circuit of the excitation coil 1C connected to the electromagnetic driver 40.

When a predetermined time has elapsed after outputting the FET control signal CS for stopping the supply of the electric power to the gate terminal of the power supply FET 310, the power control circuit 301 outputs the FET control signal CS for supplying the electric power to the gate terminal of the power supply FET 310. For example, this is because a failure such as short circuit has not occurred in the excitation coil 1C if an excessive excitation current flows through the excitation coil 1C because of noise such as commercial power supply noise. Thereby, the switching power supply circuit can restart (recover) supplying the electric power to the primary winding 20a of the transformer 20.

In the power supplier 30, the control power supply circuit which supplies, to the power control circuit 301, the electric power supplied to the tertiary winding 20d of transformer 20 is configured by a diode D307 and a capacitor C308. An anode terminal of the diode D307 is connected to a first terminal of the tertiary winding 20d of transformer 20. A cathode terminal of the diode D307 and a first terminal of the capacitor C308 are connected to a first terminal of the power control circuit 301. A second terminal of the capacitor C308 and a second terminal of the tertiary winding 20d of the transformer 20 are connected to a second terminal of the power control circuit 301, and grounded.

The electromagnetic driver 40 is an excitation control circuit which functions as a secondary circuit for supplying, to the excitation coil 1C, an excitation current of AC based on the rectified electric power transmitted from the transformer 20. The electromagnetic driver 40 includes a diode 1401, a capacitor C 402, a diode D403, a capacitor C404, a CPU (Central Processing Unit) 405, an excitation positive/negative controller 406, a first power supply monitor 407, a second power supply monitor 408, an excitation current controller 410, a switch element S411a, a switch element S411b, a switch element S411c, a switch element S411d, a current detection resistance R412, a diode D413, and a capacitor C414. In the electromagnetic driver 40, a power supply circuit 400 is configured by the diode D401, the capacitor C 402, the diode D403, and the capacitor C404. In the electromagnetic driver 40, the excitation electric power supply circuit is configured by the diode D413 and the capacitor C414. An excitation current control switch 411 is configured by the switch element S411a, the switch element S411b, the switch element S411c, and the switch element S411d.

The power supply circuit 400 is a secondary power supply circuit which outputs an operation electric power of the excitation current controller 410 in accordance with the electric power supplied to the secondary winding 20b of the transformer 20. Specifically, in the power supply circuit 400, the diode D401 and the capacitor C 402 output a positive voltage V+ to the excitation current controller 410 in accordance with the electric power supplied to the secondary winding 20b of the transformer 20. An anode terminal of the diode D401 is connected to a first terminal of the secondary winding 20b of the transformer 20. A cathode terminal of the diode D401 and a first terminal of the capacitor C402 are connected to a positive voltage output terminal of the power supply circuit 400, and the positive voltage output terminal outputs the positive voltage V+. A second terminal of the capacitor C 402 and a second terminal of the secondary winding 20b of and the transformer 20 are connected to a common potential (circuit common potential) in a circuit element in the electromagnetic driver 40. In the power supply circuit 400, the diode D403 and the capacitor C404 output a negative voltage V− to the excitation current controller 410 in accordance with the electric power supplied to the secondary winding 20b of the transformer 20. A cathode terminal of the diode D403 is connected to a third terminal of the secondary winding 20b of the transformer 20. An anode terminal of the diode D403 and a first terminal of the capacitor C404 are connected to a negative voltage output terminal of the power supply circuit 400, and the negative voltage output terminal outputs the negative voltage V−. A second terminal of the capacitor C404, a second terminal of the capacitor C 402, and a second terminal of the secondary winding 20b of the transformer 20 are connected to the circuit common potential.

The excitation electric power supply circuit is a secondary power supply circuit which outputs an excitation electric power in accordance with the electric power supplied to the secondary winding 20c of the transformer 20. Specifically, in the excitation electric power supply circuit, the diode D413 and the capacitor C414 output an excitation electric power to the excitation current controller 410 in accordance with the electric power supplied to the secondary winding 20c of the transformer 20. An anode terminal of the diode D413 is connected to a first terminal of the secondary winding 20c of the transformer 20. A cathode terminal of the diode D413 and a first terminal of the capacitor C414 are connected to a first output terminal of the excitation electric power supply circuit, and the first output terminal of the excitation electric power supply circuit outputs the excitation electric power. A second terminal of the capacitor C414 and a second terminal of the secondary winding 20c of the transformer 20 are connected to a second output terminal of the excitation electric power supply circuit, and the second output terminal of the excitation electric power supply circuit outputs the excitation electric power.

The excitation current controller 410 operates based on the positive voltage V+ and the negative voltage V− output from the power supply circuit 400. The excitation current controller 410 controls the excitation current corresponding to the excitation electric power output from the first output terminal of the excitation electric power supply circuit to be a constant current value under the control of the CPU 405. The excitation current of the constant current value controlled by the excitation current controller 410 is an excitation current to be supplied to the excitation coil 1C. The excitation current controller 410 outputs the excitation current of the constant current value to the excitation current control switch 411. In the electromagnetic driver 40, the excitation current of AC is output to the excitation coil 1C by operation of the excitation current control switch 411.

The excitation current control switch 411 supplies, to the excitation coil 1C, the excitation current of the constant current value output from the excitation current controller 410 as an excitation current of AC, under the control of the excitation positive/negative controller 406. Specifically, when the excitation current control switch 411 outputs the excitation current of the constant current value output from the excitation current controller 410, the excitation current control switch 411 switches a direction of the excitation current flowing through the excitation coil 1C into a positive direction or a negative direction under the control of the excitation positive/negative controller 406. In the excitation current control switch 411, a first terminal of the switch element S411a and a first terminal of the switch element S411b are connected to each other, and the first terminal of the switch element S411a and the first terminal of the switch element S411b are connected to the excitation current controller 410. In an excitation current control switch 411, a second terminal of the switch element S411c and a second terminal of the switch element S411d are connected to each other, and the second terminal of the switch element S411c and the second terminal of the switch element S411d are connected to a second output terminal of the excitation electric power supply circuit. In the excitation current control switch 411, a second terminal of the switch element S411a and a first terminal of the switch element S411c are connected to each other, and the second terminal of the switch element S411a and the first terminal of the switch element S411c are connected to a first terminal of the excitation coil 1C. In the excitation current control switch 411, a second terminal of the switch element S411b and a first terminal of the switch element S411d are connected to each other, and the second terminal of the switch element S411b and the first terminal of the switch element S411d are connected to a first terminal of the current detection resistance R412 and connected to the circuit common potential. In the electromagnetic driver 40, a second terminal of the current detection resistance R412 is connected to a second terminal of the excitation coil 1C. The current detection resistance R412 is a resistance for detecting a value of the current flowing through the excitation coil 1C.

In the excitation current control switch 411, a control terminal of the switch element S411a and a control terminal of the switch element S411d are connected to a terminal of the excitation positive/negative controller 406 from which a switch element switching signal SC is output. The excitation positive/negative controller 406 controls the switch element S411a and the switch element S411d to be turned on (short-circuit state) or turned off (open state) simultaneously. In the excitation current control switch 411, a control terminal of the switch element S411b and a control terminal of the switch element S411c are connected to a terminal of the excitation positive/negative controller 406 from which a switch element switching signal SC2 is output. The excitation positive/negative controller 406 controls the switch element S411b and the switch element S411c to be turned on (short-circuit state) or turned off (open state) simultaneously.

The excitation positive/negative controller 406 controls the switch elements provided in the excitation current control switch 411 under the control of the CPU 405 in order to switch the direction of the excitation current to be output to the excitation coil 1C. Specifically, for example, it is considered that a direction from the first terminal to the second terminal in the excitation coil 1C is a positive direction in which the excitation current flows. In this case, the excitation positive/negative controller 406 generates the switch element switching signal SC1 for turning on the switch elements (short-circuit state), and outputs the generated switch element switching signal SC to the excitation current control switch 411. On the other hand, the excitation positive/negative controller 406 generates the switch element switching signal SC2 for turning off the switch elements (open state), and outputs the generated switch element switching signal SC2 to the excitation current control switch 411. For this reason, in the excitation current control switch 411, both the switch element S411a and the switch element S411d are turned on (short-circuit state), and both the switch element S411b and the switch element S411c are turned off (open state). Thereby, the excitation current output from the excitation current controller 410 flows in the positive direction in an order of the switch element S411a, the first terminal of the excitation coil 1C, the second terminal of the excitation coil 1C, the current detection resistance R412, and the switch element S411d.

On the other hand, for example, it is considered that a direction from the second terminal to the first terminal in the excitation coil 1C is a negative direction in which the excitation current flows. In this case, the excitation positive/negative controller 406 generates the switch element switching signal SC1 for turning off the switch elements (open state), and outputs the generated switch element switching signal SC1 to the excitation current control switch 411. On the other hand, the excitation positive/negative controller 406 generates the switch element switching signal SC2 for turning on the switch elements (short-circuit state), and outputs the generated switch element switching signal SC2 to the excitation current control switch 411. For this reason, in the excitation current control switch 411, both the switch element S411a and the switch element S411d are turned off (open state), and both the switch element S411b and the switch element S411c are turned on (short-circuit state). Thereby, the excitation current output from the excitation current controller 410 flows in the negative direction in an order of the switch element S411b, the current detection resistance R412, the second terminal of the excitation coil 1C, the first terminal of the excitation coil 1C, and the switch element S411c.

The CPU 405 is a controller for controlling the electromagnetic driver 40 totally. The CPU 405 starts operating when the electric power is supplied from the power supplier 30 to the electromagnetic driver 40 via the transformer 20. In a normal operation of the electromagnetic driver 40, the CPU 405 controls the excitation positive/negative controller 406 and the excitation current controller 410 in order to supply the excitation current to the excitation coil 1C.

In the electromagnetic driver 40, the electric power (positive voltage V+) output from the positive voltage output terminal by the power supply circuit 400 is also output to other components provided in the electromagnetic driver 40 such as the CPU 405 and the excitation positive/negative controller 406. Accordingly, in the electromagnetic driver 40, the CPU 405 and the excitation positive/negative controller 406 operate based on the electric power (positive voltage V+) output from the power supply circuit 400. However, the positive voltage V+ output by the power supply circuit 400 is a voltage value of an operation electric power of the excitation current controller 410. Therefore, for example, in a case that the CPU 405 is a general CPU, a voltage value for driving the excitation current controller 410 is different from a voltage value for driving the CPU 405. Specifically, for example, the excitation current controller 410 is operated by ±8.0 [V] or ±6.0 [V], whereas the CPU 405 is operated a 5V system (+5.0 [V]) or a 3V system (+3.3 [V]). In this case, in the electromagnetic driver 40, a voltage converter (so-called, DC-DC converter) (not shown) may convert the positive voltage V+, which has been output from the power supply circuit 400, into an appropriate voltage value for the CPU 405.

In the electromagnetic driver 40, the electric power (positive voltage V+) output from the positive voltage output terminal of the power supply circuit 400 is also output to the first power supply monitor 407 and the second power supply monitor 408.

The first power supply monitor 407 detects a voltage value of the positive voltage V+ output from the power supply circuit 400 in order to monitor a state of the power supply circuit 400. If the voltage value of the detected positive voltage V+ is lower than a predetermined first voltage monitoring value VM1, the first power supply monitor 407 outputs to the CPU 405 a first power monitoring signal PM1 representing that the voltage value of the positive voltage V+ is lower than the first voltage monitoring value VM1. The voltage value of the first voltage monitoring value VM used by the first power supply monitor 407 for monitoring the voltage value of the positive voltage V+ is a threshold value for detecting the lowest voltage value which can continue normal operation of the electromagnetic driver 40. The first power supply monitor 407 compares the voltage value of the detected positive voltage V+ and the voltage value of the first voltage monitoring value VM1. If the voltage value of the detected positive voltage V+ is lower than the voltage value of the first voltage monitoring value VM1, the first power supply monitor 407 outputs to the CPU 405 the first power monitoring signal PM1 representing that the voltage value of the positive voltage V+ is lower than the voltage value of the first voltage monitoring value VM1. In other words, the first power supply monitor 407 outputs to the CPU 405 the first power monitoring signal PM1 representing that the voltage value of the electric power output from the power supplier 30 and transmitted by the transformer 20 becomes a voltage value which cannot continue the normal operation of the electromagnetic driver 40.

If the first power monitoring signal PM1 representing that the voltage value of the positive voltage V+ is lower than the first voltage monitoring value VM1 has been input to the CPU 405, the CPU 405 performs a process (for example, an initializing (resetting) process) of stopping the entire operation of the electromagnetic driver 40 in order to safely stop the entire operation of the electromagnetic driver 40. Therefore, the voltage value which has a predetermined margin compared with the voltage value resulting in stopping the CPU 405 (in other words, the voltage value which can complete the process for safely stopping the entire operation of the electromagnetic driver 40) is set as the voltage value of the first voltage monitoring value VM1. Specifically, for example, if the CPU 405 operates in a 5V system (+5.0 [V]), +4.2 [V] is set as the voltage value of the first voltage monitoring value VM1. For example, if the CPU 405 operates in a 3V system (+3.3 [V]), +2.5 [V] is set as the voltage value of the first voltage monitoring value VM1.

On the other hand, if the voltage value of the detected positive voltage V+ is higher than or equal to the predetermined first voltage monitoring value VM1, the first power supply monitor 407 outputs to the CPU 405 the first power monitoring signal PM1 representing that the voltage value of the positive voltage V+ is higher than or equal to the first voltage monitoring value VM1. The CPU 405 continues the entire operation of the electromagnetic driver 40 while the first power monitoring signal PM1 representing that the voltage value of the positive voltage V+ is higher than or equal to the first voltage monitoring value VM1 is input to the CPU 405.

After the first power monitoring signal PM1 representing that the voltage value of the positive voltage V+ is lower than the first voltage monitoring value VM1 has been input to the CPU 405, if the first power monitoring signal PM1 representing that the voltage value of the positive voltage V+ is higher than or equal to the first voltage monitoring value VM1 is input to the CPU 405 again, the CPU 405 performs a process (for example, a starting process) of starting the entire operation of the electromagnetic driver 40 in order to safely start (restart) the entire operation of the electromagnetic driver 40.

The second power supply monitor 408 detects the voltage value of the positive voltage V+ output from the power supply circuit 400 in order to monitor the state of the power supply circuit 400. If the voltage value of the detected positive voltage V+ is lower than a predetermined second voltage monitoring value VM2, the second power supply monitor 408 outputs to the CPU 405 a second power monitoring signal PM2 representing that the voltage value of the positive voltage V+ is lower than the second voltage monitoring value VM2. The operation of the second power supply monitor 408 is the operation as the first power supply monitor 407. However, the voltage value of the positive voltage V+ monitored by the second power supply monitor 408 is different from the voltage value of the positive voltage V+ monitored by the first power supply monitor 407. The voltage value of the second voltage monitoring value VM2 used by the second power supply monitor 408 for monitoring the voltage value of the positive voltage V+ is a threshold value for detecting a voltage value which is expected that the excitation coil 1C has been broken because of short-circuit or the like. Therefore, the voltage value of the second voltage monitoring value VM2 used by the second power supply monitor 408 for monitoring the voltage value of the positive voltage V+ is higher than the voltage value of the first voltage monitoring value VM1 used by the first power supply monitor 407 for monitoring the voltage value of the positive voltage V+. A voltage value used for determining whether to stop supplying the excitation current to the excitation coil 1C or not is set as the voltage value of the second voltage monitoring value VM2. Specifically, for example, if the CPU 405 operates in a 5V system (+5.0 [V]), +4.6 [V] is set as the voltage value of the second voltage monitoring value VM2. For example, if the CPU 405 operates in a 3V system (+3.3 [V]), +2.8 [V] is set as the voltage value of the second voltage monitoring value VM2.

As the voltage value of the second voltage monitoring value VM2, the same voltage value may be set regardless of the voltage value for operating the CPU 405, and a different voltage value may be set based on the voltage value for operating the CPU 405. In other words, the same voltage value may be set as the voltage value of the second voltage monitoring value VM2 in a case of the CPU 405 operating in a 5V system (+5.0 [V]) and in a case of the CPU 405 operating in a 3V system (+3.3 [V]). Otherwise, a different voltage value may be set as the voltage value of the second voltage monitoring value VM2 in a case of the CPU 405 operating in a 5V system (+5.0 [V]) and in a case of the CPU 405 operating in a 3V system (+3.3 [V]). This is because, in the electromagnetic driver 40, when the CPU 405 is operating, the second power supply monitor 408 detects an occurrence of a failure such as a short circuit in the excitation coil 1C, and stops only the excitation current supplied to the excitation coil 1C. In other words, like the power control circuit 301 provided in the power supplier 30, for example, it is because any failure such as short circuit has not occurred in the excitation coil 1C if an excessive excitation current flows through the excitation coil 1C because of noise such as commercial power supply noise. Thereby, the electromagnetic driver 40 can restart (resume) supplying the excitation current to the excitation coil 1C again.

The second power supply monitor 408 compares the voltage value of the detected positive voltage V+ and the voltage value of the second voltage monitoring value VM2. If the voltage value of the detected positive voltage V+ is lower than the voltage value of the second voltage monitoring value VM2, the second power supply monitor 408 outputs to the CPU 405 the second power monitoring signal PM2 representing that the voltage value of the positive voltage V+ is lower than the voltage value of the second voltage monitoring value VM2. If the second power monitoring signal PM2 representing that the voltage value of the positive voltage V+ is lower than the second voltage monitoring value VM2 has been input to the CPU 405, since a failure such as a short circuit occurs in the excitation coil 1C, the CPU 405 determines to stop supplying the excitation current to the excitation coil 1C. Thereafter, the CPU 405 switches an excitation current instruction signal EC instructing to output the excitation current into a state instructing to stop outputting the excitation current. The excitation current instruction signal EC is output to the excitation current controller 410. Thereby, the excitation current controller 410 stops supplying, to the excitation coil 1C, the excitation current of constant current value in accordance with the excitation electric power output from the first output terminal of the excitation electric power supply circuit. That is, the excitation current controller 410 stops outputting the excitation current to the excitation current control switch 411. In other words, the excitation current controller 410 turns off (open state) the switch elements provided in the excitation current control switch 411.

On the other hand, if the voltage value of the detected positive voltage V+ is higher than or equal to the predetermined second voltage monitoring value VM2, the second power supply monitor 408 outputs to the CPU 405 the second power monitoring signal PM2 representing that the voltage value of the positive voltage V+ is higher than or equal to the second voltage monitoring value VM2. The CPU 405 makes the excitation current instruction signal EC in a state instructing to output the excitation current (in other words, in a state continuing to output the excitation current) while the second power monitoring signal PM2 representing that the voltage value of the positive voltage V+ is higher than or equal to the second voltage monitoring value VM2 is input to the CPU 405. The excitation current instruction signal EC is output to the excitation current controller 410. Thereby, the electromagnetic driver 40 supplies, to the excitation coil 1C, the excitation current of AC corresponding to the excitation current of the constant current value output from the excitation current controller 410.

After the second power monitoring signal PM2 representing that the voltage value of the positive voltage V+ is lower than the second voltage monitoring value VM2 has been input to the CPU 405, if the second power monitoring signal PM2 representing that the voltage value of the positive voltage V+ is higher than or equal to the second voltage monitoring value VM2 is input to the CPU 405 again, the CPU 405 switches the excitation current instruction signal EC instructing to stop outputting the excitation current to a state instructing to output the excitation current again. Therefore, based on the excitation current instruction signal EC, the CPU 405 controls the excitation current controller 410 to start (restart) supplying the excitation current to the excitation coil 1C.

However, the CPU 405 counts a number of times the second power monitoring signal PM2 output from the second power supply monitor 408 is changed from a state representing that the voltage value of the positive voltage V+ is higher than or equal to the second voltage monitoring value VM2 to a state representing that the voltage value of the positive voltage V+ is lower than the second voltage monitoring value VM2. If the count value becomes more than or equal to a predetermined number of times within a predetermined period, the CPU 405 determines that a failure such as short circuit has occurred in the excitation coil 1C and the coil component has disappeared. In other words, if the second power monitoring signal PM2 output from the second power supply monitor 408 has repeated a state representing that a voltage value of the positive voltage V+ is lower than the second voltage monitoring value VM2 and a state representing that a voltage value of the positive voltage V+ is higher than or equal to the second voltage monitoring value VM2 a predetermined number of times within the predetermined period, the CPU 405 determines that a failure such as short circuit has occurred in the excitation coil 1C and the coil component has disappeared. Specifically, if the voltage value of the positive voltage V+ monitored by the second power supply monitor 408 is decreased, the CPU 405 determines that an excessive excitation current flows through the excitation coil 1C because of an actual failure such as a short circuit, and the limit circuit (the current detection resistance R315 and the power control circuit 301) provided in the power supplier 30 repeats stopping and restarting the supply of the electric power to the primary winding 20a of the transformer 20 by the switching power supply circuit. Therefore, the CPU 405 continues making the excitation current instruction signal EC in a state instructing to stop outputting the excitation current. The excitation current instruction signal EC is output to the excitation current controller 410. Thereafter, even if the second power monitoring signal PM2 representing that the voltage value of the positive voltage V+ is higher than or equal to the second voltage monitoring value VM2 has been input, the CPU 405 does not control the excitation current controller 410 to supply the excitation current to the excitation coil 1C. Thereby, in the drive circuit 10 and an electromagnetic flowmeter including the drive circuit 10 as an excitation circuit, it can be prevented that the circuit elements in the switching power supply circuit, the power supplier 30, and the electromagnetic driver 40 are deteriorated and broken when time has elapsed because of the repetition of stopping and restarting the power supply in the switching power supply circuit.

The CPU 405 can determine that the excessive excitation current flowing through the excitation coil 1C is not caused by a sporadic noise based on the number of times of repeating the two states (a voltage value lower than the second voltage monitoring value VM2 and a voltage value higher than or equal to the second voltage monitoring value VM2) in the second power monitoring signal PM2 used for determining whether or not a failure such as a short circuit has occurred in the excitation coil 1C. It is desirable that the number of times of the repetition is more than or equal to a predetermined number of times which can suppress a deterioration of the circuit elements as much as possible. For example, the number of times of repeating the two states in the second power monitoring signal PM2 used for determining whether or not a failure such as a short circuit has occurred in the excitation coil 1C may be three or five. For example, it is desirable that the period in which the CPU 405 determines that the two states in the second power monitoring signal PM2 are repeated is decided based on a predetermined constant time from when the power control circuit 301 controls the FET control signal CS to be in a state indicating to stop supplying the electric power to when the power control circuit 301 controls the FET control signal CS to be in a state indicating to supply the electric power again.

If a state in which the count value is not more than or equal to the predetermined number of times has been continued for the predetermined period (in other words, if the period decided as described above has elapsed after starting counting the two states in the second power monitoring signal PM2), the CPU 405 determines that a failure such as a short circuit does not occur in the excitation coil 1C, and the CPU 405 clears (initializes) the count value. Thereafter, the CPU 405 counts the two states in the second power monitoring signal PM2 from the start. The period decided as described above is decided based on a predetermined constant period determined so that, after the power control circuit 301 has controlled the FET control signal CS to be in a state indicating to stop supplying the electric power, the power control circuit 301 controls the FET control signal CS to be in a state indicating to supply the electric power again. The CPU 405 determines that the two states in the second power monitoring signal PM2 are repeated in accordance with the period.

Figure 2:
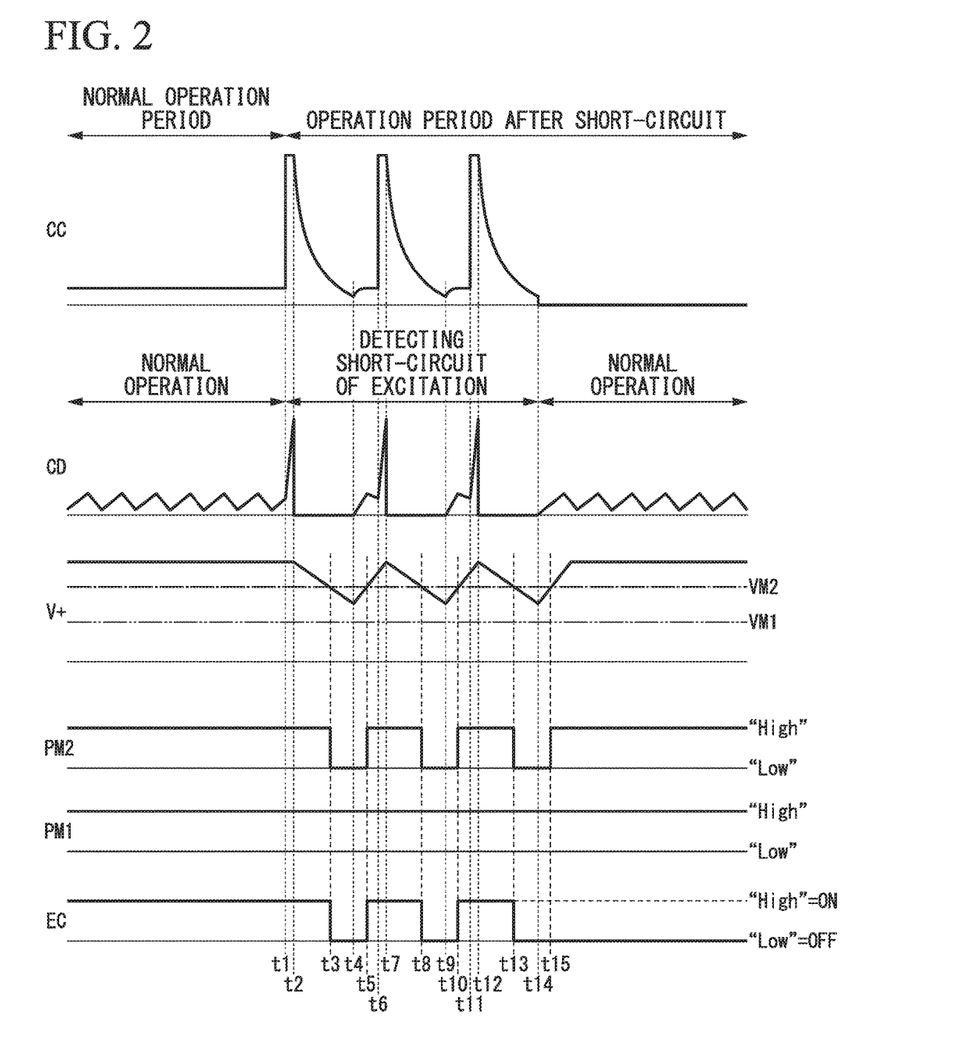
FIG. 2 is a waveform diagram illustrating an example of the operation of the drive circuit in the present embodiment.

Next, an operation of the drive circuit 10 will be described. Here, a case where a fault such as a short circuit has occurred in the excitation coil 1C when the drive circuit 10 supplies the excitation current to the excitation coil 1C in an electromagnetic flowmeter will be described. FIG. 2 is a waveform diagram illustrating an example of the operation of the drive circuit 10 in the present embodiment (a supply operation of the excitation current to the excitation coil 1C). In the example of the operation of the drive circuit 10 shown in FIG. 2, the CPU 405 determines that a failure such as a short circuit has occurred in the excitation coil 1C when it has been detected three times or more that an excessive excitation current flows through the excitation coil 1C. In FIG. 2, waveforms (signals) and waveform (signal) levels of an excitation current CC supplied to the excitation coil 1C by the drive circuit 10, a current detection signal CD detected by the current detection resistance R315, the positive voltage V+, the first power monitoring signal PM1, the second power monitoring signal PM2, and the excitation current instruction signal EC are shown.

In the following description, in order to describe simply, an example where the drive circuit 10 does not switch, to the positive direction or the negative direction, the direction of the excitation current CC flowing through the excitation coil 1C, and the excitation current CC flows in one of the directions (for example, the positive direction), will be described. In other words, in the following description, a example where the excitation positive/negative controller 406 provided in the electromagnetic driver 40 in the drive circuit 10 does not switch to turn on (short-circuit state) and turn off (open state) the switch elements provided in the excitation current control switch 411, and the excitation current CC flowing in one direction is supplied to the excitation coil 1C, will be described. In this case, the excitation current CC shown in FIG. 2 corresponds to the excitation current output from the excitation current controller 410 provided in the electromagnetic driver 40 in the drive circuit 10. FIG. 2 shows a level (current waveform) of the current value of the excitation current CC schematically.

In a normal operation period shown in FIG. 2, the current detection resistance R315 provided in the power supplier 30 in the drive circuit 10 outputs the current detection signal CD of a level representing a normal operation in accordance with a current value of the detected current flowing through the switching power supply circuit. Thereby, the power control circuit 301 provided in the power supplier 30 in the drive circuit 10 outputs the FET control signal CS to the gate terminal of the power supply FET 310, and the power supply FET 310 performs a switching operation. Therefore, an electric power of stable level is supplied from the switching power supply circuit to the primary winding 20a of the transformer 20. Thereafter, the power supply circuit 400 provided in the electromagnetic driver 40 in the drive circuit 10 outputs the positive voltage V+ of constant voltage value in accordance with the electric power of stable level transmitted to the secondary winding 20b of the transformer 20.

Therefore, the CPU 405 provided in the electromagnetic driver 40 in the drive circuit 10 outputs, to the excitation current controller 410, the excitation current instruction signal EC instructing to output the excitation current ("High" shown in FIG. 2), and the excitation current of constant current value is output from the excitation current controller 410 to the excitation current control switch 411. The excitation positive/negative controller 406 provided in the electromagnetic driver 40 in the drive circuit 10 controls the excitation current control switch 411 under the control of the CPU 405 so that the excitation current CC of constant current value flows through the excitation coil 1C.

At this time, since the first power supply monitor 407 provided in the electromagnetic driver 40 in the drive circuit 10 monitors the positive voltage V+ which is higher than or equal to the first voltage monitoring value VM1, the first power supply monitor 407 outputs to CPU 405 the first power monitoring signal PM1 ("High" shown in FIG. 2) representing that the positive voltage V+ is higher than or equal to the first voltage monitoring value VM1. Since the second power supply monitor 408 provided in the electromagnetic driver 40 in the drive circuit 10 also monitors the positive voltage V+ which is higher than or equal to the second voltage monitoring value VM2, the second power supply monitor 408 outputs to CPU 405 the second power monitoring signal PM2 ("High" shown in FIG. 2) representing that the positive voltage V+ is higher than or equal to the second voltage monitoring value VM2.

In the normal operation period shown in FIG. 2, this state is continued, and the drive circuit 10 operates normally.

Here, it is thought that a failure such as a short circuit occurs in the excitation coil 1C and the coil component disappears at the timing t1. For this reason, an excessive excitation current CC flows through the excitation coil 1C before the excitation current controller 410 follows the change in the positive voltage V+ and the negative voltage V− output from the power supply circuit 400, and the level of the current value of the excitation current CC is increased rapidly. Then, an excessive current also flows through the power supplier 30 temporarily because of the excessive excitation current CC flowing through the excitation coil 1C. The current detection resistance R315 outputs to the power control circuit 301 the current detection signal CD of a level corresponding to the current value of the excessive current flowing temporarily.

Therefore, at the timing t2, the power control circuit 301 controls the FET control signal CS to be in a state instructing to stop supplying the electrical power in accordance with the current detection signal CD representing the excessive current value. The switching power supply circuit stops supplying the electric power to the primary winding 20a of the transformer 20 under the control. Thereafter, in the power supply circuit 400, the voltage value of the positive voltage V+ is decreased in accordance with the level of the electric power transmitted to the secondary winding 20b of the transformer 20. Thereby, the level of the current value of the excessive excitation current CC flowing through the excitation coil 1C is decreased gradually.

A decrease amount of the voltage value of the positive voltage V+ (in other words, a difference (width) between voltage values before and after the decrease of the positive voltage V+ or a time constant) is determined in accordance with a capacitance value of the capacitor C402 for outputting the positive voltage V+ in the power supply circuit 400. Therefore, in the power supply circuit 400, the capacitance value of the capacitor C402 is set so that sufficient charges remain in the capacitor C402 during a predetermined constant period in which the power control circuit 301 provided in the power supplier 30 controls the FET control signal CS to be in a state instructing to stop supplying the electric power (in other words, a period for which the switching power supply circuit has stopped supplying the electric power to the primary winding 20a of the transformer 20). Thereby, the second power supply monitor 408 can detect the positive voltage V+ lower than the second voltage monitoring value VM2.

Thereafter, at the timing t3, when the second power supply monitor 408 detects the positive voltage V+ lower than the second voltage monitoring value VM2, the second power supply monitor 408 outputs to the CPU 405 the second power monitoring signal PM2 representing that the voltage value of the detected positive voltage V+ is lower than the second voltage monitoring value VM2 ("Low" shown in FIG. 2). When the second power monitoring signal PM2 representing that the voltage value of the positive voltage V+ is lower than the second voltage monitoring value VM2 is input from the second power supply monitor 408 to the CPU 405, the CPU 405 sets "1" into the count value for counting a number of times of inputting the second power monitoring signal PM2. Thereafter, the CPU 405 makes the excitation current instruction signal EC in a state ("Low" shown in FIG. 2) instructing to stop outputting the excitation current. Thereby, the excitation current controller 410 stops outputting the excitation current of constant current value to the excitation current control switch 411, and the excitation current CC of constant current value output from the excitation current control switch 411 is stopped. In other words, the excitation current CC supplied from the electromagnetic driver 40 to the excitation coil 1C is stopped. At this time, the excitation positive/negative controller 406 may control the excitation current control switch 411 under the control of the CPU 405. Specifically, the excitation positive/negative controller 406 may turn off (open state) the switch element S411a, the switch element S411b, the switch element S411c, and the switch element S411d provided in the excitation current control switch 411 by using the switch element switching signal SC1 and the switch element switching signal SC2.

Since the voltage value of the positive voltage V+ at the timing t3 is higher than or equal to the first voltage monitoring value VM1 monitored by the first power supply monitor 407, the first power monitoring signal PM1 which has been output to the CPU 405 by the first power supply monitor 407 is maintained to be in a state ("High" shown in FIG. 2) representing that the voltage value of the positive voltage V+ is higher than or equal to the first voltage monitoring value VM1. Therefore, the CPU 405 does not perform an initializing (resetting) process for stopping the entire operation of the electromagnetic driver 40 safely and continues the normal operation of the electromagnetic driver 40.

Thereafter, at the timing t4 when a predetermined constant period has elapsed, the power control circuit 301 controls the FET control signal CS to be in a state instructing to supply the electric power again. Thereby, the power supply FET 310 restarts the switching operation, and the switching power supply circuit restarts supplying the electric power to the primary winding 20a of the transformer 20. In the power supply circuit 400, the voltage value of the positive voltage V+ increases in accordance with the electric power transferred to the secondary winding 20b of the transformer 20.

Thereafter, at the timing t5, when the second power supply monitor 408 detects the positive voltage V+ higher than or equal to the second voltage monitoring value VM2, the second power supply monitor 408 outputs to the CPU 405 the second power monitoring signal PM2 representing that the voltage value of the detected positive voltage V+ is higher than or equal to the second voltage monitoring value VM2. Thereby, the CPU 405 makes the excitation current instruction signal EC in a state instructing to output the excitation current. Thereafter, the excitation current controller 410 restarts outputting the excitation current of constant current value to the excitation current control switch 411. The excitation positive/negative controller 406 restarts controlling the excitation current control switch 411 under the control of the CPU 405, and the excitation current CC of constant current value flows through the excitation coil 1C again.

Here, if the excessive excitation current CC flowing through the excitation coil 1C at the timing t1 is caused by a sporadic noise (in other words, if a failure has not occurred in the excitation coil 1C), the operation of the state is also continued after the timing t5, and the drive circuit 10 returns to the normal operation which is the same as the operation of the normal operation period shown in FIG. 2. In this case, if a predetermined period has elapsed after the second power monitoring signal PM2 representing that the voltage value of the positive voltage V+ is higher than or equal to the second voltage monitoring value VM2 was input from the second power supply monitor 408 to the CPU 405, the CPU 405 clears the count value for counting the number of times of inputting the second power monitoring signal PM2, and sets "0" into the count value.

However, in this case, a failure such as a short circuit has occurred in the excitation coil 1C at the timing t1. Therefore, at the timing t6, an excessive excitation current CC flows through the excitation coil 1C, and a level of the current value of the excitation current CC increases rapidly similar to the timing t1.

Thereby, during a period from the timing t7 to the timing t10, each component provided in the power supplier 30 and the electromagnetic driver 40 provided in the drive circuit 10 performs the same operations as the operations in a period from the timing t2 to the timing t5 again, and stops supplying the excitation current CC to the excitation coil 1C. Thereafter, at the timing t10, each component provided in the power supplier 30 and the electromagnetic driver 40 restarts supplying the excitation current CC to the excitation coil 1C again. At the timing t8, the CPU 405 adds "1" to the count value for counting the number of times of inputting the second power monitoring signal PM2. In other words, the CPU 405 sets "2" to the count value of the number of times of inputting the second power monitoring signal PM2.

Thereafter, at the timing t11, an excessive excitation current CC flows through the excitation coil 1C caused by the failure such as a short circuit occurred at the timing t1, and a level of the current value of the excitation current CC increases rapidly similar to the timing t6.

Thereby, at the timing t12 and the timing t13, each component provided in the power supplier 30 and the electromagnetic driver 40 in the drive circuit 10 performs the same operations as the operations at the timings t2 and t3 and the timings t7 and t8 again, and stops supplying the excitation current CC to the excitation coil 1C. At the timing t13, the CPU 405 adds "1" to the count value for counting the number of times of inputting the second power monitoring signal PM2 in order to set "3" to the count value. At this time, since the count value for counting the number of times of inputting the second power monitoring signal PM2 becomes "3", the CPU 405 determines that the second power monitoring signal PM2 representing that the voltage value of the positive voltage V+ is lower than the second voltage monitoring value VM2, which has been input from the second power supply monitor 408 at the timing t13, is caused by a failure such as short circuit which has occurred in the excitation coil 1C at the timing t1. In other words, the CPU 405 determines that a failure such as a short circuit has occurred in the excitation coil 1C.

Thereafter, at the timing t14 when a predetermined time has elapsed, the power control circuit 301 performs the same operations as the operations at the timing t4 and the timing t9 again, and the power control circuit 301 controls the FET control signal CS in a state instructing to supply the electric power again. Thereby, the power supply FET 310 restarts the switching operation, and the switching power supply circuit restarts supplying the electric power to the primary winding 20a of the transformer 20. Thus, in the power supply circuit 400, the voltage value of the positive voltage V+ increases in accordance with the electric power transferred to the secondary winding 20b of the transformer 20.

Thereafter, at the timing t15, when the second power supply monitor 408 detects the positive voltage V+ higher than or equal to the second voltage monitoring value VM2, the second power supply monitor 408 outputs to the CPU 405 the second power monitoring signal PM2 representing that the voltage value of the detected positive voltage V+ is higher than or equal to the second voltage monitoring value VM2, similar to the timing t5 and the timing t10.

However, at the timing t13, the CPU 405 has determined that a failure such as a short circuit has occurred in the excitation coil 1C. For this reason, based on the second power monitoring signal PM2 representing that the voltage value of the positive voltage V+ is higher than or equal to the second voltage monitoring value VM2, which has been input from the second power supply monitor 408 at the timing t15, the CPU 405 determines that the limit circuit provided in the power supplier 30 has repeated stopping and restarting the power supply to the primary winding 20a of the transformer 20 by the switching power supply circuit. Based on the result of the determination, at the timing t15, the CPU 405 control the excitation current controller 410 to continue stopping outputting the excitation current without making the excitation current instruction signal EC in a state instructing to output the excitation current. Thereby, the excitation current controller 410 does not restart outputting the excitation current to the excitation current control switch 411, and the excitation current controller 410 continues stopping outputting the excitation current.

For this reason, after the timing t15, the excitation current CC of constant current value does not flow through the excitation coil 1C again. Therefore, the drive circuit 10 does not detect that the excessive excitation current CC flows through the excitation coil 1C, and the power supplier 30 continues supplying the electric power to the primary winding 20a of the transformer 20 by the switching power supply circuit performing the switching operation of the power supply FET 310. Thereby, the power supply circuit 400 continues outputting the positive voltage V+ in accordance with the electric power transmitted to the secondary winding 20b of the transformer 20. For example, the positive voltage V+ continued supplying by the power supply circuit 400 can be used effectively when the CPU 405 continues performing a process of notifying that a failure such as a short circuit has occurred in the excitation coil 1C. For example, the CPU 405 may transmit to a display device (not shown) failure information representing that a failure such as a short circuit has occurred in the excitation coil 1C, and the display device may display the failure information received from the CPU 405. Thereby, the drive circuit 10 can prompt a worker who performs an inspection work to repair or replace the excitation coil 1C which has failed.

In this way, in the drive circuit 10, stopping and restarting the power supply are not repeated by the switching power supply circuit after it is determined that a failure such as a short circuit has occurred in the excitation coil 1C. For this reason, even if time has elapsed in this state, it can be prevented that the switching power supply circuit, the power supplier 30, and the circuit elements in the electromagnetic driver 40 are deteriorated and broken.

By the way, in a conventional drive circuit which does not have a function for determining whether or not a fault such as a short circuit has occurred in the excitation coil, an excessive excitation current also flows through the excitation coil after the timing t5 shown in FIG. 2, and stopping and restarting the power supply in the switching power supply circuit are repeated. If this repetition has been repeated for a long time, components and circuit elements provided in the conventional drive circuit are deteriorated and broken. The conventional drive circuit is different from the drive circuit 10 of the present embodiment, and the conventional drive circuit does not stop the excitation current CC supplied to the excitation coil 1C in accordance with the second power monitoring signal PM2 output by the second power supply monitor 408. For this reason, in the conventional drive circuit, if the power supply in the switching power supply circuit has been stopped, the voltage value of the positive voltage V+ may be lower than a lowest voltage value with which the CPU provided in the conventional drive circuit can continue the normal operation. In this case, the conventional drive circuit is different from the drive circuit 10 of the present embodiment, and the conventional drive circuit cannot continue the process of notifying that a fault such as a short circuit occurs in the excitation coil.

As described above, the drive circuit 10 of the present embodiment includes a second power supply monitor 408 which monitors the voltage value of the positive voltage V+ output from the power supply circuit 400. In the drive circuit 10 of the present embodiment, the second power supply monitor 408 detects that the voltage value of the positive voltage V+ is higher than or equal to the first voltage monitoring value VM1 and lower than the second voltage monitoring value VM2. The first voltage monitoring value VM1 is a voltage value used for determining whether to perform a process (for example, an initializing (resetting) process) of stopping the entire operation of the electromagnetic driver 40. The second voltage monitoring value VM2 is a voltage value used for determining whether an excessive excitation current flows because of a fault such as a short circuit which has occurred in the excitation coil 1C.

If the drive circuit 10 of the present embodiment detects that the voltage value of the positive voltage V+ becomes lower than the second voltage monitoring value VM2, the drive circuit 10 stops outputting the excitation current in order not to supply the excitation current to the excitation coil 1C. Thereafter, the drive circuit 10 of the present embodiment restarts outputting the voltage value of the positive voltage V+ from the power supply circuit 400. If the drive circuit 10 of the present embodiment detects that the voltage value of the positive voltage V+ becomes higher than or equal to the second voltage monitoring value VM2, the drive circuit 10 restarts outputting the excitation current in order to supply the excitation current to the excitation coil 1C.

Further, the drive circuit 10 of the present embodiment determines whether or not the count value, which counts the number of times the voltage value of the positive voltage V+ becomes lower than the second voltage monitoring value VM2, has become more than or equal to a predetermined number of times. If the count value has become more than or equal to the predetermined number of times, the drive circuit 10 of the present embodiment determines that a fault such as a short circuit, which causes that the voltage value of the positive voltage V+ becomes lower than the second voltage monitoring value VM2 and an excessive excitation current flows, has occurred in the excitation coil 1C. In other words, if the voltage value of the positive voltage V+ has been repeated to become a low voltage value lower than the second voltage monitoring value VM2 and a high voltage value higher than or equal to the second voltage monitoring value VM2, the drive circuit 10 of the present embodiment determines whether the number of times of the repetition becomes more than or equal to a predetermined number of times. If the number of times of the repetition has become more than or equal to the predetermined number of times, the drive circuit 10 of the present embodiment determines that a failure has occurred in the excitation coil 1C. If the drive circuit 10 of the present embodiment determines that a fault has occurred in the excitation coil 1C, the drive circuit 10 of the present embodiment controls the excitation current not to flow through the excitation coil 1C. In other words, the drive circuit 10 of the present embodiment continues stopping the output of the excitation current in order to continue not to supply the excitation current to the excitation coil 1C which has failed.

As described above, the drive circuit 10 of the present embodiment does not supply the excitation current to the excitation coil 1C which has failed. Thereby, stopping and restarting the power supply in the switching power supply circuit is not repeated, and it can be prevented that components and circuit elements in the drive circuit 10 is deteriorated and broken because of the repetition of stopping and restarting the power supply.

Even if the drive circuit 10 of the present embodiment does not supply the excitation current to the excitation coil 1C which has failed, the drive circuit 10 of the present embodiment continues outputting the voltage value of the positive voltage V+ from the power supply circuit 400. Therefore, the drive circuit 10 of the present embodiment can perform the process of notifying the failure of the excitation coil 1C continuously. Thereby, the drive circuit 10 of the present embodiment can prompt a worker who performs an inspection work to repair or replace the excitation coil 1C which has failed, and the excitation coil 1C can be recovered to be a normal state in a short time.

<Example of Application>

Figure 3:
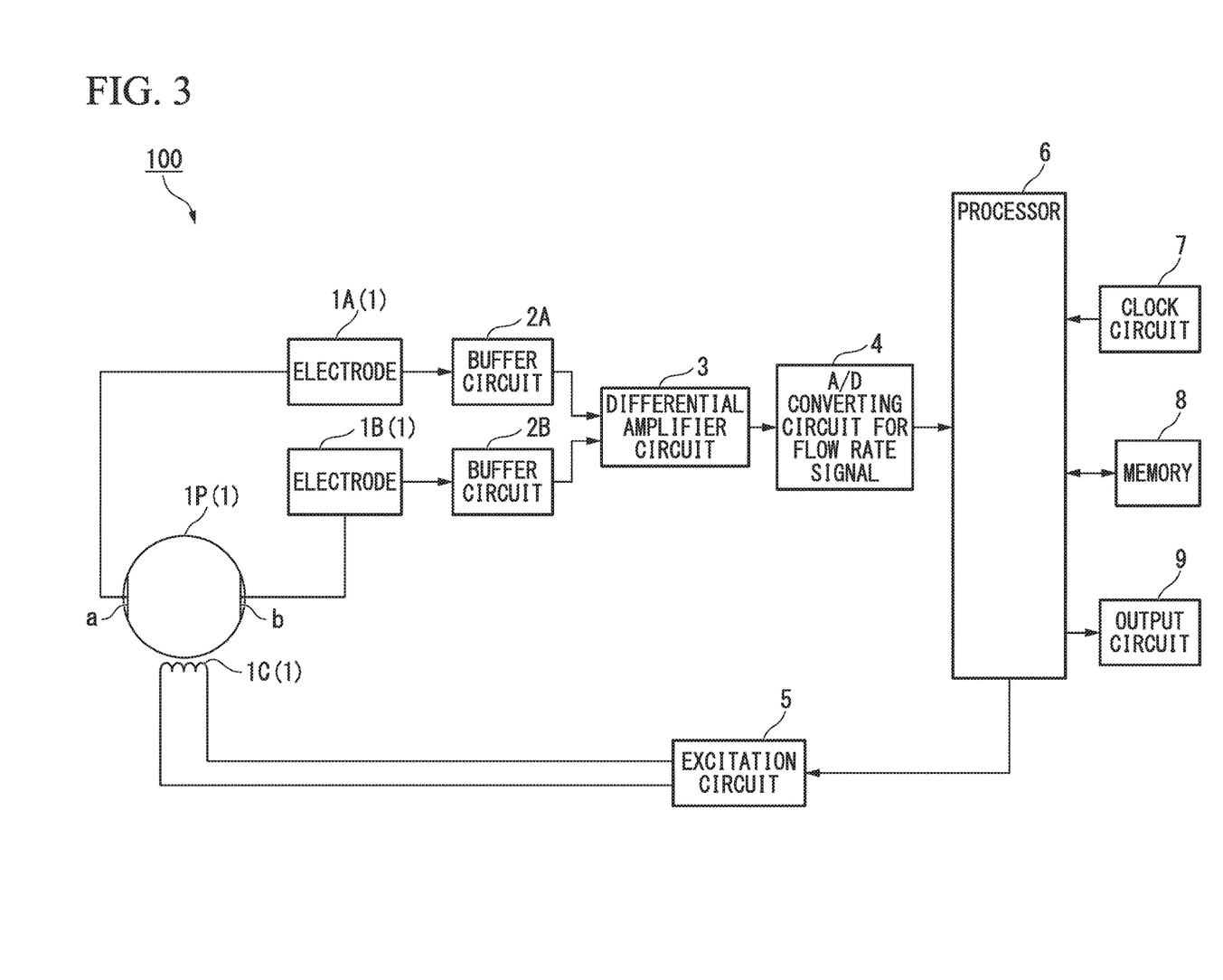
FIG. 3 is a block diagram illustrating a schematic configuration of the electromagnetic flowmeter which has the drive circuit in the present embodiment.

Next, an example of application of the drive circuit in the present invention will be described. In the following description, an electromagnetic flowmeter to which the drive circuit of the present invention is applied as an excitation circuit for supplying an excitation current for generating a magnetic field by an excitation coil provided in the sensor will be described. FIG. 3 is a block diagram illustrating a schematic configuration of the electromagnetic flowmeter which has the drive circuit 10 in the present embodiment. The electromagnetic flowmeter 100 includes a sensor 1, a buffer circuit 2A, a buffer circuit 2B, a differential amplifier circuit 3, an A/D converting circuit 4, an excitation circuit 5, a processor 6, a clock circuit 7, a memory 8, and an output circuit 9. The sensor 1 includes a pair of detection electrodes (a detection electrode 1A and a detection electrodes 1B), an excitation coil 1C, and a measurement pipe 1P.

The excitation coil 1C provided in the sensor 1 in the electromagnetic flowmeter 100 supplies an excitation current to the drive circuit 10 shown in FIG. 1. Components and circuit elements in the drive circuit 10 shown in FIG. 1 are disposed separately in each of the components provided in the electromagnetic flowmeter 100. For example, the CPU 405, the first power supply monitor 407, and the second power supply monitor 408 provided in the electromagnetic driver 40 in the drive circuit 10, are disposed in the processor 6. Otherwise, the processor 6 provided in the electromagnetic flowmeter 100 may include only the CPU 405 provided in the drive circuit 10, and the first power monitor 407 and the second power supply monitor 408 may be disposed outside the processor 6. For example, the excitation positive/negative controller 406, the excitation current controller 410, the excitation current control switch 411, and the current detection resistance R412 provided in the electromagnetic driver 40 in the drive circuit 10, are disposed in the excitation circuit 5. For example, the power supply circuit 400 and the excitation electric power supply circuit provided in the drive circuit 10, and the transformer 20 and the power supplier 30 provided in the drive circuit 10, are disposed in the power supplier (not shown) provided in the electromagnetic flowmeter 100. Among the components provided in the drive circuit 10, components which is different from the components (for example, the CPU 405, the first power supply monitor 407, and the second power monitoring section 408) disposed in the processor 6, may be disposed in the excitation circuit 5. The components of the electromagnetic flowmeter 100, in which components and circuit elements of the driver circuit 10 shown in FIG. 1 are disposed, are not limited to the example described above. For example, the components and the circuit elements of the drive circuit 10 may be disposed in any of the components provided in the electromagnetic flowmeter 100.

The electromagnetic flowmeter 100 is a field device installed in a facility such as a pipe disposed in the plant. The plant includes a petroleum refining plant, a gas producing/supplying plant, a production plant of chemistry or medicine, a plant controlling to mine a wellhead (for example, a gas field and an oil field) and controlling a transporting pipeline thereof, a power-generating plant (for example, hydro power, thermal power, nuclear power, solar power, and wind power), a monitoring control plant of water supply and sewerage, and so on. In the following description, an example where the electromagnetic flowmeter 100 is disposed on a pipe installed in the plant, and the electromagnetic flowmeter 100 calculates a flow rate based on a velocity (fluid velocity) of a conductive fluid (for example, a product or a semi-product in the form of liquid such as industrial water and chemicals) which is a measurement target liquid flowing through the measurement pipe 1P, will be described.

The electromagnetic flowmeter 100 calculates the fluid velocity of the fluid flowing through the measurement pipe 1P based on a flow rate signal (voltage signal) measured by the sensor 1. Thereafter, the electromagnetic flowmeter 100 calculates the flow rate based on the calculated fluid velocity, and outputs the calculated flow rate as a measurement signal. In the electromagnetic flowmeter 100, the excitation coil 1C provided in the sensor 1 is disposed outside the measurement pipe 1P. The detection electrode 1A and the detecting electrode 1B, which are a pair of detection electrodes provided in the sensor 1, are disposed on an inner surface of the measurement pipe 1P where the fluid contacts (position a or position b shown in FIG. 3). The position of the detection electrode 1A and the position of the detection electrode 1B are opposed to each other. However, in FIG. 3, in order to describe simply, each of the detection electrode 1A disposed on the position a and the detection electrode 1B disposed on the position b is shown as a block, and shown in a position adjacent to a corresponding buffer circuit 2A or 2B.

In the sensor 1, the excitation coil 1C generates a magnetic field to the measurement pipe 1P. Each of the detection electrode 1A and the detection electrode 1B detects an electromotive force (voltage) generated in the fluid (in other words, the fluid flowing between the detection electrode 1A and the detection electrode 1B in the measurement pipe 1P) flowing through the magnetic field generated by the excitation coil 1C. The detection electrode 1A outputs a flow rate signal indicating the detected electromotive force (voltage value) to the corresponding buffer circuit 2A. The detection electrode 1B outputs a flow rate signal indicating the detected electromotive force (voltage value) to the corresponding buffer circuit 2B.

The excitation circuit 5 outputs, to the excitation coil 1C provided in the sensor 1, an excitation current of AC which is necessary for generating the magnetic field in the measurement pipe 1P. The excitation circuit 5 supplies the excitation current to the excitation coil 1C under the control of the CPU 405 disposed in the processor 6. Thereby, the excitation coil 1C generates the magnetic field around the measurement pipe 1P in accordance with the supplied excitation current. An electromotive force is generated in the fluid flowing through the magnetic field generated by the excitation coil 1C in accordance with the excitation current output from the excitation circuit 5. The flow rate signal indicating the electromotive force (voltage value) generated in the fluid is output from the detection electrode 1A and the detection electrode 1B to the buffer circuit 2A and the buffer circuit 2B respectively.

Each of the buffer circuit 2A and the buffer circuit 2B is a buffer circuit for transmitting, to the differential amplifier circuit 3, the flow rate signal which has been output to the detection electrode 1A and the detection electrode 1B respectively. Each of the buffer circuit 2A and the buffer circuit 2B converts an impedance of the flow rate signal which has output from each of the detection electrode 1A and the detection electrode 1B, and outputs to the differential amplifier circuit 3 the flow rate signal of which impedance has been converted.

The differential amplifier circuit 3 calculates a difference between the flow rate signal output from the detection electrode 1A and the flow rate signal output from the detection electrode 1B. The differential amplifier circuit 3 amplifies a signal level of the calculated difference of the flow rate signal, and outputs the difference to the A/D converting circuit 4. In the following description, the difference of the flow rate signal output from the differential amplifier circuit 3 to the A/D converting circuit 4 will be called as "differential flow rate signal". The differential amplifier circuit 3 calculates the difference between the flow rate signals output from the buffer circuit 2A and the buffer circuit 2B. Thereby, in the electromagnetic flowmeter 100, a differential flow rate signal, in which a noise (for example, a noise of in-phase component such as a commercial power supply noise) contained in the flow rate signals has been removed, is output to the A/D converting circuit 4.

The A/D converting circuit 4 performs an analog/digital conversion to the differential flow rate signal (analog signal) output from the differential amplifier circuit 3, and generates a digital signal (hereinafter, called as "differential digital flow rate signal") of a digital value according to a signal level of the flow rate signal detected by the sensor 1. The A/D converting circuit 4 outputs the generated differential digital flow rate signal to the processor 6. The differential digital flow rate signal which has been output from the A/D converting circuit 4 is used for a calculation process for calculating the fluid velocity of the fluid flowing through the measurement pipe 1P in a normal measurement operation in the electromagnetic flowmeter 100.

The clock circuit 7 oscillates a clock, and supplies a signal of the oscillated clock to the processor 6 as a clock signal for operating the processor 6. The clock signal supplied from the clock circuit 7 to the processor 6 may be any type of clock signal, such as a signal of a source oscillation clock signal and a signal of a divided clock signal of the source oscillation clock signal.

The processor 6 operates based on the clock signal output from the clock circuit 7, and the processor 6 is a controller for controlling the components provided in the electromagnetic flowmeter 100. For example, the processor 6 may be a central processing unit (CPU) or the like. The processor 6 controls whole of the components provided in the electromagnetic flowmeter 100 in accordance with one or more application programs and data for implementing a function of the electromagnetic flowmeter 100. The processor 6 is also a calculation processor which performs a predetermined calculation process for calculating the fluid velocity in a normal measurement operation in the electromagnetic flowmeter 100 in accordance with one or more application programs which have been executed. The processor 6 outputs to the output circuit 9 a digital signal or a pulse width modulation (PWM) signal representing the result of the calculation process (for example, a flow rate calculated based on the fluid velocity of the fluid flowing through the measurement pipe 1P).

The memory 8 is a storage device storing one or more application programs executed by the processor 6 and data to which calculation process is being performed. For example, the memory 8 may be various types of memories such as a ROM (Read Only Memory), a RAM (Random Access Memory), and a flash memory. Storing (writing) the data into the memory 8 and outputting (reading) the data from the memory 8 are performed under the control of the processor 6.

The output circuit 9 outputs, to the outside of the electromagnetic flowmeter 100, the digital signal or the PWM signal representing the flow rate of the fluid flowing through the measurement pipe 1P, which has been output from the processor 6, as a measurement signal measured by the electromagnetic flowmeter 100. For example, the output circuit 9 may convert a digital value represented by the digital signal output from the processor 6 into a digital value of a predetermined range, and the output circuit 9 may output the converted digital value as the measurement signal of the digital signal. For example, the output circuit 9 may convert the measurement signal into a DC analog signal in the range from 4 [mA] to 20 [mA], and may output the DC analog signal as an analog signal (current signal). In this case, the output circuit 9 converts the digital value represented by the digital signal output from the processor 6 into a DC analog signal represented by a signal level in the range from 4 [mA] to 20 [mA], and the output circuit 9 outputs the DC analog signal.

The output circuit 9 may output a communication signal, which has been superimposed on the measurement signal of the DC analog signal, via a communication network constructed exclusively for the plant to outside of the electromagnetic flowmeter 100 (for example, a control device which controls an operation of facilities in the plant). For example, the communication signal superimposed on the measurement signal of the DC analog signal may be a communication signal conforming to communication standards such as HART (registered trademark), BRAIN (registered trademark), or the like.

The communication network constructed in the plant may be a communication network for transmitting and receiving data between the electromagnetic flowmeter 100 and the control device in accordance with various types of communication standards and methods. For example, the communication network constructed in the plant may be an industrial wireless standard such as ISA100.11a, a wireless standard such as a sensor network system, a communication standard in which wireless and wired are mixed such as Wireless/Wired HART (registered trademark), a communication standard of a master/slave method such as MODBUS (registered trademark), FOUNDATION (registered trademark) fieldbus, PROFIBUS (registered trademark), or the like. For example, the communication network may be a communication network for transmitting and receiving data between the electromagnetic flowmeter 100 and the control device in conformity with a general wireless standard such as Wi-Fi (registered trademark). In this case, the output circuit 9 can output (transmit) the digital signal, which has output from the processor 6, to outside of the electromagnetic flowmeter 100 such as the control device, as a measurement signal of the digital signal, without performing a digital/analog conversion to the DC analog signal.

A measurement operation for measuring the fluid velocity of the fluid flowing through the measurement pipe 1P in the electromagnetic flowmeter 100 will be described. In the measurement operation, the electromagnetic flowmeter 100 detects an electromotive force (voltage) generated by the fluid flowing through the magnetic field generated by the excitation coil 1C by using a pair of detection electrodes (the detection electrode 1A and the detection electrode 1B). The differential amplifier circuit 3 calculates a difference between the flow signals output from the detection electrode 1A and the detection electrode 1B, and the differential amplifier circuit 3 outputs to the A/D) converting circuit 4 a differential flow rate signal in which a noise of in-phase component has been removed. The A/D converting circuit 4 performs an analog/digital conversion to the differential flow rate signal (analog signal) to generate a differential digital flow rate signal, and the A/D converting circuit 4 outputs to the processor 6 the generated differential digital flow rate signal. Thereafter, the processor 6 calculates a fluid velocity based on the differential digital flow rate signal output from the A/D converting circuit 4, and the processor 6 calculates a flow rate based on the calculated fluid velocity. The output circuit 9 outputs the flow rate calculated by the processor 6, as a measurement signal, to outside of the electromagnetic flowmeter 100. The measurement operation in the electromagnetic flowmeter 100 is the same as the measurement operation for measuring a fluid velocity of fluid in a general electromagnetic flowmeter. Therefore, details about the measurement operation of the electromagnetic flowmeter 100 will be omitted.

The electromagnetic flowmeter 100 includes a drive circuit 10 as an excitation circuit for supplying an excitation current to the excitation coil 1C. Therefore, if an excessive excitation current flows through the excitation coil 1C, the excitation circuit determines whether a failure such as a short circuit has occurred or not. If the excitation circuit determines that a failure such as a short circuit has occurred, the excitation circuit stops supplying the excitation current to the excitation coil 1C. Thereby, it can be prevented that the components provided in the electromagnetic flowmeter 100 are broken caused by a failure such as a short circuit which has occurred in the excitation coil 1C because of an excessive excitation current flowing through the excitation coil 1C. In the electromagnetic flowmeter 100, only supplying the excitation current to the excitation coil 1C is stopped, but the power supply operates normally. Thereby, the electromagnetic flowmeter 100 can notify a worker performing the inspection work that a failure has occurred in the excitation coil 1C, and can prompt the worker to repair or replace the excitation coil 1C which has failed. Even if the drive circuit 10 is provided in the electromagnetic flowmeter 100, the operation of the drive circuit 10 is the same as the operation of the drive circuit 10 described in FIG. 2. Therefore, details of an operation when a failure such as a short circuit has occurred in the excitation coil 1C in the electromagnetic flowmeter 100 will be omitted.

As described above, the electromagnetic flowmeter 100 includes the drive circuit 10 of the present embodiment can obtain the same effect as the effect of the drive circuit 10.

As described above, according to the embodiment of the present invention, the drive circuit 10 includes a power supply monitor which monitors a voltage value of a voltage output from a power supply circuit. In the present embodiment, the power supply monitor detects that the voltage value of the voltage output from the power supply circuit becomes higher than the first threshold value and lower than the second threshold value. The first threshold is a voltage value used for determining whether to perform a process of stopping the entire operation of the electromagnetic driver. The second threshold is a voltage value used for determining whether an excessive excitation current flows because of a fault such as a short circuit which has occurred in the excitation coil.

In the present embodiment, if the drive circuit has detected that the voltage value of the voltage output from the power supply circuit becomes lower than the second threshold, the drive circuit does not supply the excitation current to the excitation coil. Thereafter, in the present embodiment, outputting the voltage from the power supply circuit is restarted. If the drive circuit has detected that the voltage value becomes higher than or equal to the second threshold value, the drive circuit restarts outputting the excitation current in order to supply the excitation current to the excitation coil.

Further, in the present embodiment, the drive circuit determines whether or not a count value, which counts a number of times the voltage value of the voltage output from the power supply circuit becomes lower than the second threshold value, has become more than or equal to a predetermined number of times. If the count value has become more than or equal to the predetermined number of times, the drive circuit determines that a fault such as a short circuit, which causes that the voltage value becomes lower than the second threshold value and an excessive excitation current flows, has occurred in the excitation coil. In other words, in the present embodiment, if the number of times the voltage value of the voltage output from the power supply circuit has been repeated to become a low voltage value lower than the second threshold value and a high voltage value higher than or equal to the second threshold value becomes more than the predetermined number of times, the drive circuit determines that a failure has occurred in the excitation coil. Thereafter, in the present embodiment, if the drive circuit determines that a fault has occurred in the excitation coil 1C, the drive circuit controls the excitation current not to flow through the excitation coil. Thereby, the drive circuit continues not to supply the excitation current to the excitation coil which has failed.

As described above, in the present embodiment, the drive circuit does not supply the excitation current to the excitation coil which has failed. Thereby, stopping and restarting the power supply in the power supply circuit is not repeated, and it can be prevented that components and circuit elements in the drive circuit is deteriorated and broken because of the repetition of stopping and restarting the power supply. In other words, it can be prevented that the failure of the excitation coil causes a failure of other components and other circuit elements provided in the drive circuit.

Even if the drive circuit of the present embodiment does not supply the excitation current to the excitation coil which has failed, the drive circuit continues outputting the voltage from the power supply circuit. Therefore, the drive circuit of the present embodiment can perform the process of notifying the failure of the excitation coil continuously. Thereby, the drive circuit of the present embodiment can prompt a worker who performs an inspection work to repair or replace the excitation coil which has failed, and the excitation coil can be recovered to be a normal state in a short time.

In the present embodiment, an example of the drive circuit 10 which supplies to the excitation coil 1C the excitation current of AC which is switched to the positive direction or the negative direction has been described. However, the excitation current supplied to the excitation coil 1C by the drive circuit 10 is not limited to the excitation current of AC described in the embodiment. For example, even if the excitation current supplied to the excitation coil 1C by the drive circuit 10 is an excitation current flowing in only one direction of the positive direction and the negative direction, the same effect as the effect of the drive circuit 10 of the present embodiment can be obtained by applying the present embodiment.

In the present embodiment, a case where the limit circuit provided in the power supplier 30 in the drive circuit 10 limits the electric power supplied to the primary winding 20a of the transformer 20 by the switching power supply circuit by using the current detection resistance R315 and the power control circuit 301, has been described. However, the configuration of the limit circuit is not limited to the configuration described in the embodiment. For example, even if the limit circuit limits the electric power supplied to the primary winding 20a of the transformer 20 based the electric power or heat, the limit circuit can be operated similarly to the drive circuit 10 described in the embodiment.

In the present embodiment, an example where the drive circuit 10 is applied (mounted) to the electromagnetic flowmeter 100 has been described. However, a device to which the drive circuit 10 is applied (mounted) is not limited to the electromagnetic flowmeter. For example, the drive circuit 10 of the present embodiment can be also applied (mounted) to another field device, a motor, a pump, and a drive circuit of an inductor such as a coil having an inductance component.

As used herein, the following directional terms "front, back, above, downward, right, left, vertical, horizontal, below, transverse, row and column" as well as any other similar directional terms refer to those instructions of a device equipped with the present invention. Accordingly, these terms, as utilized to describe the present invention should be interpreted relative to a device equipped with the present invention.

The term "configured" is used to describe a component, unit or part of a device includes hardware and/or software that is constructed and/or programmed to carry out the desired function.

Moreover, terms that are expressed as "means-plus function" in the claims should include any structure that can be utilized to carry out the function of that part of the present invention.

The term "unit" is used to describe a component, unit or part of a hardware and/or software that is constructed and/or programmed to carry out the desired function. Typical examples of the hardware may include, but are not limited to, a device and a circuit.

While preferred embodiments of the present invention have been described and illustrated above, it should be understood that these are examples of the present invention and are not to be considered as limiting. Additions, omissions, substitutions, and other modifications can be made without departing from the scope of the present invention. Accordingly, the present invention is not to be considered as being limited by the foregoing description, and is only limited by the scope of the claims.

What is claimed is:

1. A drive circuit which drives an excitation coil for generating a magnetic field, the drive circuit comprising:
   a primary power supplier configured to supply a primary electric power to a primary winding of a transformer;
   a secondary power supplier configured to supply an operation electric power and an excitation electric power, the operation electric power being output in accordance with a secondary electric power supplied to a secondary winding of the transformer in accordance with the primary electric power supplied to the primary winding, a voltage value of the excitation electric power being different from a voltage value of the operation electric power;
   an excitation current supplier to which the excitation electric power is supplied, the excitation current supplier being configured to supply an excitation current to the excitation coil;
   a power supply monitor configured to compare the voltage value of the operation electric power with a predetermined voltage threshold, the power supply monitor being configured to output monitoring information representing whether or not the voltage value of the operation electric power is lower than the voltage threshold; and
   a controller configured to determine whether a short circuit has occurred in the excitation coil based on the monitoring information, the controller being configured to stop supplying the excitation current from the excitation current supplier to the excitation coil if the controller determines that the short circuit has occurred in the excitation coil,
   wherein the voltage threshold is higher than a lowest voltage value with which the controller operates, and the voltage threshold is a voltage value representing that the short circuit has occurred in the excitation coil,
   wherein the controller is configured to count a first number of times the monitoring information changes from a state representing that the voltage value of the operation electric power is higher than or equal to the voltage threshold to a state representing that the voltage value of the operation electric power is lower than the voltage threshold, and
   wherein the controller continues to stop supplying the excitation current from the excitation current supplier to the excitation coil if the first number of times is more than or equal to a predetermined second number of times.

2. The drive circuit according to claim 1,
   wherein if the monitoring information represents that the voltage value of the operation electric power is higher than or equal to the voltage threshold after the controller has stopped supplying the excitation current, the controller determines that the short circuit has not occurred in the excitation coil, and controls the excitation current supplier to supply the excitation current to the excitation coil.

3. The drive circuit according to claim 1,
   wherein the primary power supplier comprises:
   a limit circuit configured to stop supplying the primary electric power in accordance with a change of the excitation electric power in a case that the short circuit has occurred in the excitation coil.

4. The drive circuit according to claim 3,
   wherein the limit circuit is configured to restart supplying the primary electric power when a predetermined constant period has elapsed after the limit circuit has stopped supplying the primary electric power.

5. The drive circuit according to claim 4,
   wherein the controller is configured to count the first number of times within a count period predetermined based on the constant period.

6. The drive circuit according to claim 5,
   wherein the limit circuit is configured to initialize the first number of times if the first number of times is less than the second number of times within the count period.

7. The drive circuit according to claim 3,
   wherein the limit circuit is configured to detect a change of the excitation electric power based on a current value of the excitation electric power.

8. The drive circuit according to claim 1,
   wherein the excitation current supplier comprises:
   an excitation positive/negative controller configured to control a direction of the excitation current flowing through the excitation coil, and
   wherein the excitation current supplier is configured to supply to the excitation coil the excitation current of which the direction has been switched to a positive direction or a negative direction.

9. The drive circuit according to claim 1,
   wherein if the controller determines that the short circuit has occurred in the excitation coil, the controller transmits to a display device failure information representing that the short circuit has occurred in the excitation coil so that the controller makes the display device display the failure information.

10. An electromagnetic flowmeter which measures a flow rate of fluid flowing through a magnetic field generated in a measurement pipe, the electromagnetic flowmeter comprising:
    a drive circuit which drives an excitation coil for generating the magnetic field in the measurement pipe,
    wherein the drive circuit comprises:
    a primary power supplier configured to supply a primary electric power to a primary winding of a transformer;
    a secondary power supplier configured to supply an operation electric power and an excitation electric power, the operation electric power being output in accordance with a secondary electric power supplied to a secondary winding of the transformer in accordance with the primary electric power supplied to the primary winding, a voltage value of the excitation electric power being different from a voltage value of the operation electric power;
    an excitation current supplier to which the excitation electric power is supplied, the excitation current supplier being configured to supply an excitation current to the excitation coil;
    a power supply monitor configured to compare the voltage value of the operation electric power with a predetermined voltage threshold, the power supply monitor being configured to output monitoring information representing whether or not the voltage value of the operation electric power is lower than the voltage threshold; and
    a controller configured to determine whether a short circuit has occurred in the excitation coil based on the monitoring information, the controller being configured to stop supplying the excitation current from the excitation current supplier to the excitation coil if the controller determines that the short circuit has occurred in the excitation coil, wherein the voltage threshold is higher than a lowest voltage value with which the controller operates, and the voltage threshold is a voltage value representing that the short circuit has occurred in the excitation coil, wherein the controller is configured to count a first number of times the monitoring information changes from a state representing that the voltage value of the operation electric power is higher than or equal to the voltage threshold to a state representing that the voltage value of the operation electric power is lower than the voltage threshold, and wherein the controller continues to stop supplying the excitation current from the excitation current supplier to the excitation coil if the first number of times is more than or equal to a predetermined second number of times.

11. The electromagnetic flowmeter according to claim 10, wherein if the monitoring information represents that the voltage value of the operation electric power is higher than or equal to the voltage threshold after the controller has stopped supplying the excitation current, the controller determines that the short circuit has not occurred in the excitation coil, and controls the excitation current supplier to supply the excitation current to the excitation coil.

12. The electromagnetic flowmeter according to claim 10, wherein the primary power supplier comprises:

a limit circuit configured to stop supplying the primary electric power in accordance with a change of the excitation electric power in a case that the short circuit has occurred in the excitation coil.

13. The electromagnetic flowmeter according to claim 12, wherein the limit circuit is configured to restart supplying the primary electric power when a predetermined constant period has elapsed after the limit circuit has stopped supplying the primary electric power.

14. The electromagnetic flowmeter according to claim 13, wherein the controller is configured to count the first number of times within a count period predetermined based on the constant period.

15. The electromagnetic flowmeter according to claim 14, wherein the limit circuit is configured to initialize the first number of times if the first number of times is less than the second number of times within the count period.

16. The electromagnetic flowmeter according to claim 12, wherein the limit circuit is configured to detect a change of the excitation electric power based on a current value of the excitation electric power.

17. The electromagnetic flowmeter according to claim 10, wherein the excitation current supplier comprises:

an excitation positive/negative controller configured to control a direction of the excitation current flowing through the excitation coil, and wherein the excitation current supplier is configured to supply to the excitation coil the excitation current of which the direction has been switched to a positive direction or a negative direction.

18. The electromagnetic flowmeter according to claim 10, wherein if the controller determines that the short circuit has occurred in the excitation coil, the controller transmits to a display device failure information representing that the short circuit has occurred in the excitation coil so that the controller makes the display device display the failure information.

* * * * *